United States Patent
Sakata et al.

(10) Patent No.: US 11,336,233 B2
(45) Date of Patent: May 17, 2022

(54) AMPLIFIER

(71) Applicant: MITSUBISHI ELECTRIC CORPORATION, Tokyo (JP)

(72) Inventors: Shuichi Sakata, Tokyo (JP); Shintaro Shinjo, Tokyo (JP); Keigo Nakatani, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 16 days.

(21) Appl. No.: 17/027,924

(22) Filed: Sep. 22, 2020

(65) Prior Publication Data

US 2021/0006208 A1    Jan. 7, 2021

Related U.S. Application Data

(63) Continuation of application No. PCT/JP2018/016945, filed on Apr. 26, 2018.

(51) Int. Cl.
*H03F 1/02* (2006.01)
*H03F 1/56* (2006.01)
*H03F 3/21* (2006.01)

(52) U.S. Cl.
CPC ............. *H03F 1/0288* (2013.01); *H03F 1/56* (2013.01); *H03F 3/211* (2013.01); *H03F 2200/387* (2013.01)

(58) Field of Classification Search
CPC ...... H03F 1/56; H03F 3/211; H03F 2200/387; H03F 1/0288

(Continued)

(56) References Cited

U.S. PATENT DOCUMENTS

| | | | |
|---|---|---|---|
| 10,608,594 B2 | 3/2020 | Komatsuzaki et al. | |
| 2019/0028062 A1 | 1/2019 | Shinjo et al. | |
| 2020/0228065 A1* | 7/2020 | Ahn | H03F 1/3288 |

FOREIGN PATENT DOCUMENTS

| | | | | |
|---|---|---|---|---|
| JP | 5924730 B2 * | 5/2016 | ........... | H03F 1/0288 |
| JP | 6157759 B1 | 7/2017 | | |
| WO | WO 2017/145258 A1 | 8/2017 | | |

OTHER PUBLICATIONS

Steer, M., "Microwave and RF Design II—Transmission Lines", North Carolina State University,https://LibreTexts.org, text was compiled on Nov. 28, 2021, Chapter 2, section 2.2, pp. 76-82 (Year: 2021).*

(Continued)

*Primary Examiner* — Hafizur Rahman
(74) *Attorney, Agent, or Firm* — Birch, Stewart, Kolasch & Birch, LLP

(57) ABSTRACT

A Doherty amplifier includes: a transistor for a carrier amplifier; a transistor for a peak amplifier; a transmission line connected between an output terminal of the transistor for the carrier amplifier and an output terminal of the transistor for the peak amplifier; a stub that is connected in parallel to the output terminal of the transistor for the peak amplifier and that is capacitive and inductive in a working frequency band; and an output matching circuit connected to the output terminal of the transistor for the peak amplifier, the transmission line, and an output load, the output matching circuit to transform an impedance of the output load into an impedance lower than the impedance of the output load.

5 Claims, 8 Drawing Sheets

(58) Field of Classification Search
USPC .......................................................... 330/295
See application file for complete search history.

(56) References Cited

OTHER PUBLICATIONS

Abadi et al., "An Extended Bandwidth Doherty Power Amplifier Using a Novel Output Combiner," IEEE MTT-S International Microwave Symposium (IMS2014), Jun. 1, 2014, pp. 1-4 (2 pages).
Extended European Search Report for European Application No. 18915814.0, dated Feb. 15, 2021.
Komatsuzaki et al., "3.0-3.6 GHz Wideband, over 46% Average Efficiency GaN Doherty Power Amplifier with Frequency Dependency Compensating Circuits", IEEE Topical Conference on RF/Microwave Power Amplifiers for Radio and Wireless Applications (PAWR), 2017, pp. 22-24.
Qureshi et al., "A 700-W Peak Ultra-Wideband Broadcast Doherty Amplifier", IEEE International Microwave Symposium, 2014, total 4 pages.
European Communication pursuant to Article 94(3) EPC for European Application No. 18915814.0, dated Nov. 10, 2021.
Qureshi et al., "A Wide-Band 20W LMOS Doherty Power Amplifier," Microwave Symposim Digest, 2010, pp. 1504-1507.
Xia et al., "A Broadband High-Efficiency Doherty Power Amplifier With Integrated Compensating Reactance," IEEE Transactions on Microwave Theory and Techniques, vol. 64, No. 7, Jul. 2016, pp. 2014-2024.

* cited by examiner ial Application No. PCT/JP2018/016945, filed on Apr. 26, 2018, which is hereby expressly incorporated by reference into the present application.

TECHNICAL FIELD

The present invention relates to a Doherty amplifier.

BACKGROUND ART

Non-Patent Literature 1 discloses a conventional Doherty amplifier. The conventional Doherty amplifier includes: an input terminal; an output terminal; a carrier amplifier; a peak amplifier; a load modulation line connected to an output terminal of the carrier amplifier and having an electrical length of 90 degrees; a frequency compensation line connected to an output terminal of the peak amplifier and having an electrical length of an integral (n) multiple of 180 degrees; an output combiner that combines an output power of the load modulation line and an output power of the frequency compensation line; an output matching circuit connected to the output combiner and the output terminal; an input phase adjustment line provided on an input side of the carrier amplifier and having an electrical length corresponding to a difference (180°×n−90°) in electrical length between the load modulation line and the frequency compensation line; and an input divider that divides an input signal. Here, the carrier amplifier and the peak amplifier each include inside a transistor, an output matching circuit, and an input matching circuit.

In the conventional Doherty amplifier, an output impedance as viewed from the output terminal of the carrier amplifier toward the output terminal of the peak amplifier is open during back-off in which the operation of the peak amplifier is stopped, so that the frequency compensation line is equivalent to an open stub having an electrical length of an integral (n) multiple of 180 degrees on the peak amplifier side of the output combiner. The equivalent open stub acts in the direction of canceling the frequency dependence caused by the output matching circuit, whereby broadband matching is achieved.

CITATION LIST

Non-Patent Literature

J. H. Qureshi, et. al, "A 700-W Peak Ultra-Wideband Broadcast Doherty Amplifier", IEEE International Microwave Symposium, 2014

SUMMARY OF INVENTION

Technical Problem

The conventional Doherty amplifier is configured as described above, and thus needs a load modulation line having an electrical length of 90 degrees, a frequency compensation line having an electrical length of an integral (n) multiple of 180 degrees, and an input phase adjustment line having an electrical length corresponding to a difference (180°×n−90°) between the electrical length of the load modulation line and the electrical length of the frequency compensation line. Thus, the conventional Doherty amplifier has a problem of an increase in circuit size.

Solution to Problem

A Doherty amplifier according to the present invention includes: a transistor for a carrier amplifier; a transistor for a peak amplifier; a transmission line connected between an output terminal of the transistor for the carrier amplifier and an output terminal of the transistor for the peak amplifier; a stub that is connected in parallel to the output terminal of the transistor for the peak amplifier and that is capacitive and inductive in a working frequency band; and an output matching circuit connected to the output terminal of the transistor for the peak amplifier, the transmission line, and an output load, the output matching circuit to transform an impedance of the output load into an impedance lower than the impedance of the output load.

Advantageous Effects of Invention

The present invention has been made to solve the above problems, and an object of the present invention is to provide an amplifier capable of broadening the bandwidth of a Doherty operation without increasing a circuit size.

DESCRIPTION OF EMBODIMENTS

First Embodiment

Figure 1:
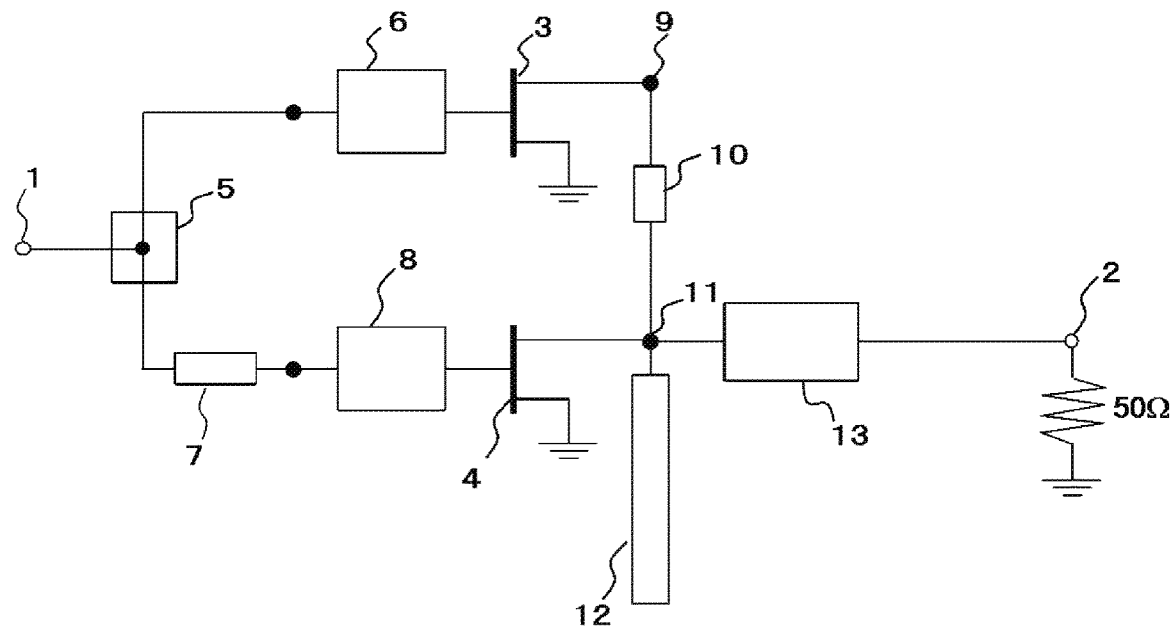
FIG. 1 is a circuit diagram showing a configuration example of a Doherty amplifier according to a first embodiment of the present invention.

FIG. 1 is a circuit diagram showing a configuration example of a Doherty amplifier according to a first embodiment of the present invention. The Doherty amplifier according to the first embodiment of the present invention includes: a high frequency signal input terminal 1; a high frequency signal output terminal 2; a transistor 3 for a carrier amplifier; a transistor 4 for a peak amplifier; an input divider 5; an input matching circuit 6 for the carrier amplifier; an input phase adjustment line 7; an input matching circuit 8 for the peak amplifier; a drain terminal 9 of the transistor for the carrier amplifier (one example of a drain terminal of a transistor for a carrier amplifier), a load modulation line 10 (one example of a transmission line); a drain terminal 11 of the transistor for the peak amplifier (an example of an output terminal of a transistor for a peak amplifier, and also referred to as an output combination point); an open stub 12 (an example of a stub); and an output matching circuit 13.

The input terminal 1 is a terminal to which an input signal for the Doherty amplifier is input. The input terminal 1 is connected to the input divider 5. For example, a wideband code division multiple access (WCDMA) (registered trademark) signal or a long term evolution (LTE) signal having a wide modulation bandwidth and large peak-to-average power ratio (PAPR) is input as an input signal.

The output terminal 2 is a terminal that is connected to an output load and that outputs an output signal amplified by the Doherty amplifier. The output terminal 2 is connected to the output matching circuit 13.

The transistor 3 for the carrier amplifier is a transistor that amplifies the input signal input from the input terminal 1 during back-off. The transistor 3 for the carrier amplifier has an output capacitance which may be intrinsic or parasitic. The transistor 3 for the carrier amplifier is generally biased in class A or class AB. For example, a bipolar transistor, a field effect transistor (FET), or the like is used as the transistor 3 for the carrier amplifier.

The transistor 4 for the peak amplifier is a transistor that does not operate during back-off, but operates during saturation and amplifies the input signal input from the input terminal 1 during saturation. The transistor 4 for the peak amplifier has an output capacitance which may be intrinsic or parasitic. The transistor 4 for the peak amplifier is generally biased in class C. For example, a bipolar transistor, a field effect transistor (FET), or the like is used as the transistor 4 for the peak amplifier.

The input divider 5 is a divider that divides the input signal into two, and outputs the divided two signals to the transistor 3 for the carrier amplifier and the transistor 4 for the peak amplifier. For example, a Wilkinson divider is used as the input divider 5.

The input matching circuit 6 for the carrier amplifier is a matching circuit that performs input matching of the transistor 3 for the carrier amplifier. For example, the input matching circuit 6 for the carrier amplifier may be a low-pass filter matching circuit, a high-pass matching circuit, a band-pass matching circuit, or the like, which includes a series inductor and a parallel capacitor.

The input phase adjustment line 7 is a line that adjusts the phase of the signal input to the transistor 4 for the peak amplifier with respect to the transistor 3 for the carrier amplifier. For example, a microstrip line is used as the input phase adjustment line 7.

The input matching circuit 8 for the peak amplifier is a matching circuit that performs input matching of the transistor 4 for the peak amplifier. For example, the input matching circuit 8 for the peak amplifier may be a low-pass filter matching circuit, a high-pass matching circuit, a band-pass matching circuit, or the like, which includes a series inductor and a parallel capacitor.

The drain terminal 9 of the transistor for the carrier amplifier is an output terminal of the transistor 3 for the carrier amplifier. The drain terminal 9 of the transistor for the carrier amplifier is directly connected to the transistor for the carrier amplifier without an output matching circuit or the like for the transistor 3 for the carrier amplifier.

The load modulation line 10 is a line that performs load modulation of the transistor 3 for the carrier amplifier in the Doherty amplifier. The load modulation line 10 is directly connected to the drain terminal 9 of the transistor for the carrier amplifier and the drain terminal of the transistor 4 for the peak amplifier. The load modulation line 10 has an electrical length of less than 90°, and the characteristic impedance thereof is larger than an output resistance of the transistor 3 for the carrier amplifier. For example, a microstrip line is used as the load modulation line 10.

The drain terminal 11 of the transistor for the peak amplifier is an output terminal of the transistor 4 for the peak amplifier. The drain terminal 11 of the transistor for the peak amplifier is directly connected to the transistor 4 for the peak amplifier without an output matching circuit or the like for the transistor 4 for the peak amplifier.

The open stub 12 is a stub directly connected in parallel to the drain terminal 11 of the transistor for the peak amplifier. The open stub 12 has an electrical length of an integral multiple of 90° at a working frequency, and is inductive as well as capacitive in a working frequency band. Further, the open stub 12 has a frequency that is open in the working frequency band. For example, an open stub having an electrical length of an integral multiple of 180° is used as the open stub 12, or a short stub having an electrical length of an integral multiple of 90° is used instead of the open stub.

The output matching circuit 13 is a matching circuit that transforms the output load connected to the output terminal 2 into an impedance lower than the output load. The output matching circuit 13 transforms the output load of 50Ω into an impedance lower than 50Ω so that the impedance as viewed from the drain terminal 11 of the transistor for the peak amplifier toward the output terminal 2 is inductive and capacitive in the working frequency band.

Next, the operation of the Doherty amplifier according to the first embodiment will be described.

The operation during back-off and the operation during saturation will be described separately.

During back-off, that is, when the peak amplifier is not operating, a high frequency signal input from the input terminal 1 is divided by the input divider 5. The signal distributed to the carrier amplifier side, out of the divided signals, is amplified by the transistor 3 for the carrier amplifier, and is output to the drain terminal 9 of the transistor 3 for the carrier amplifier.

The signal distributed to the peak amplifier side is reflected or absorbed by the transistor 4 for the peak amplifier, because the peak amplifier is not operating. Therefore, no signal is output to the drain terminal 11 of the transistor 4 for the peak amplifier.

Figure 2:
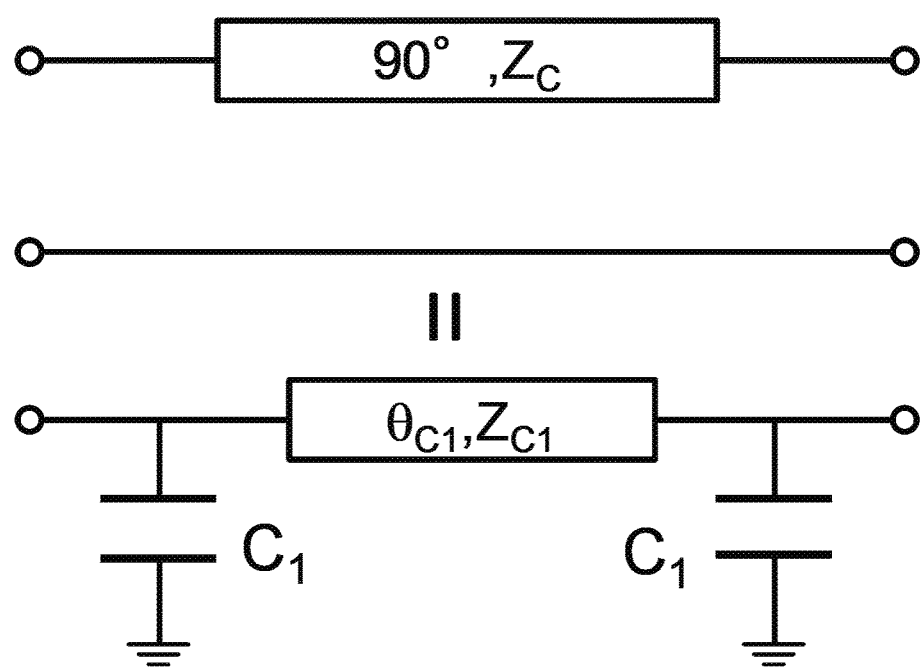
FIG. 2 is an equivalent circuit diagram for describing a principle of a load modulation line 10 in the Doherty amplifier according to the first embodiment of the present invention.

FIG. 2 is an equivalent circuit diagram for describing a principle of the load modulation line 10 in the Doherty amplifier according to the first embodiment of the present invention. A lower transmission line ($\theta_{c1}$, $Z_{c1}$) in FIG. 2 corresponds to the load modulation line 10, and C1 corresponds to the output capacitance of the transistor 3 for the carrier amplifier and the output capacitance of the transistor 4 for the peak amplifier. As shown in FIG. 2, the transmission line ($Z_c$) having an electrical length of 90 degrees can be equivalently represented by a circuit including a parallel capacitor and a transmission line. Here, when the center frequency is $f_0$, the characteristic impedance of a line having an electrical length of 90 degree is $Z_C$, the electrical length and the characteristic impedance of the transmission line are $\theta_{C1}$ and $Z_{C1}$, respectively, and the value of the parallel capacitor is $C_1$, $\theta_{C1}$ and $Z_{C1}$ are expressed by the following equation.

[Equation 1]
$$\theta_{c1} = \arccos(2\pi f_0 C_1 Z_c) < 90 deg \quad (1)$$

[Equation 2]
$$Z_{c1} = \frac{Z_c}{\sin\theta_1} \quad (2)$$

A transistor always includes a parasitic capacitance. Therefore, if the parasitic capacitance of the transistor is C1, and the real part ($R_{opt}$) of the output impedance of the transistor is $Z_C$, $\theta_{C1}$ and $Z_{C1}$ are uniquely determined, wherein $\theta_{C1}$ is always less than 90 degrees, and $Z_{C1}$ is larger than the real part ($R_{opt}=Z_C$) of the output impedance of the transistor. In other words, this means that the load modulation line 10 having an electrical length of less than 90° is equivalently regarded as a line having an electrical length of 90° in consideration of the output capacitance of the transistor 3 for the carrier amplifier and the output capacitance of the transistor 4 for the peak amplifier. In this case, the characteristic impedance $Z_c$ of the equivalent transmission line is lower than the characteristic impedance $Z_{c1}$ of the load modulation line 10. Note that, strictly speaking, the output capacitance of the transistor is classified into an intrinsic capacitance and a parasitic capacitance, and when the parasitic capacitance is large, the output capacitance is approximately equal to the parasitic capacitance.

Figure 3:
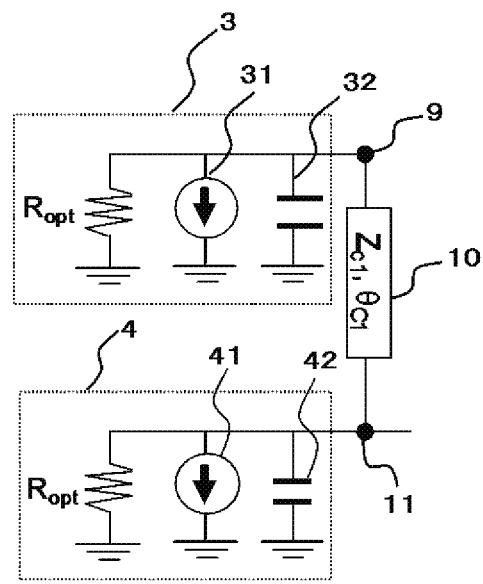
FIG. 3 is an equivalent circuit diagram showing an output part of the Doherty amplifier according to the first embodiment of the present invention.

FIG. 3 is an equivalent circuit diagram showing an output part of the Doherty amplifier according to the first embodiment of the present invention. In FIG. 3, the transistor 3 for the carrier amplifier is equivalently represented by using an output impedance ($R_{opt}$) during saturation, the current source 31, and the output capacitance 32. When the transistor 3 for the carrier amplifier and the transistor 4 for the peak amplifier are connected via a transmission line having an electrical length $\theta_{C1}$ of less than 90 degrees and characteristic impedance $Z_{C1}$, using the output capacitance 32 of the transistor as shown in FIG. 3, such configuration is equivalent to the configuration in which the transistor 3 for the carrier amplifier and the transistor 4 for the peak amplifier are connected using a line having an electrical length of 90 degrees required for the Doherty operation within the transistor 3 for the carrier amplifier and the transistor 4 for the peak amplifier.

As a result, the Doherty operation can be performed using the load modulation line 10 having an electrical length of less than 90 degrees between the transistors.

Figure 4:
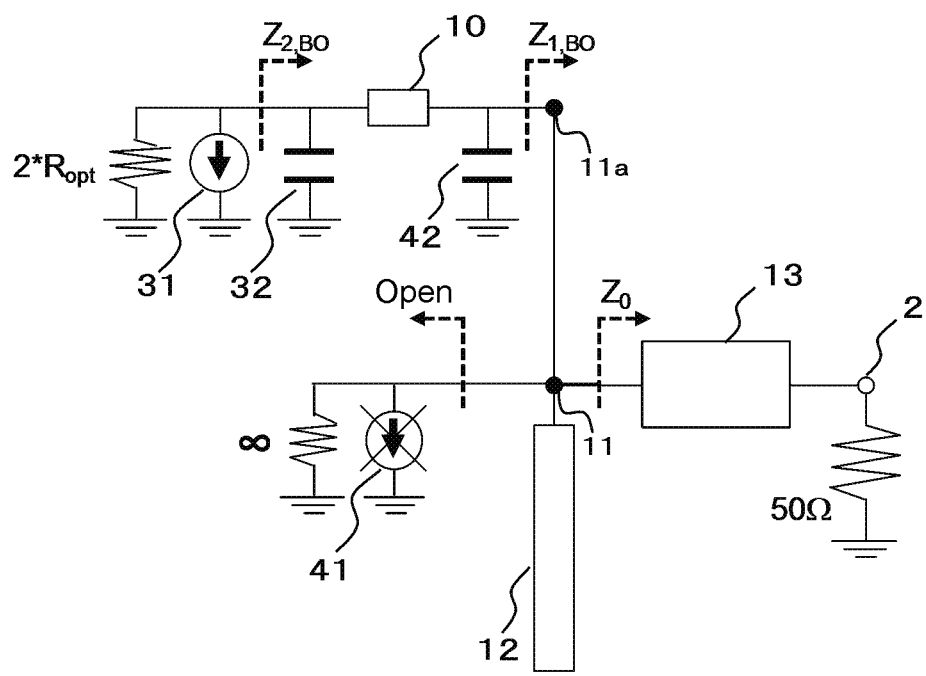
FIG. 4 is an equivalent circuit diagram showing an operation during back-off of the Doherty amplifier according to the first embodiment of the present invention.

FIG. 4 is an equivalent circuit diagram showing an operation during back-off of the Doherty amplifier according to the first embodiment of the present invention. The open stub 12 and the load modulation line 10 having an electrical length of less than 90 degrees are connected to the drain terminal 11 of the transistor 4 for the peak amplifier. Therefore, even though the output capacitance 42 of the transistor 4 for the peak amplifier is moved from the output side of the transistor 4 for the peak amplifier toward the output side of the transistor 3 for the carrier amplifier as shown in FIG. 4, both are electrically equivalent.

Since the transistor 4 for the peak amplifier is not operating during back-off, the impedance as viewed from the drain terminal 11 of the transistor for the peak amplifier toward the transistor 4 for the peak amplifier is open. The transistor 4 for the peak amplifier can be ignored during back-off. Therefore, if the open stub 12 is not provided, the impedance (Z0) as viewed from the output combination point (here, the drain terminal 11 of the transistor for the peak amplifier) toward the output matching circuit 13 and the impedance ($Z_{1,BO}$) as viewed from the output terminal (corresponding to 11a in FIG. 4) of the load modulation line 10 toward the output matching circuit 13 are equivalent.

Figure 5:
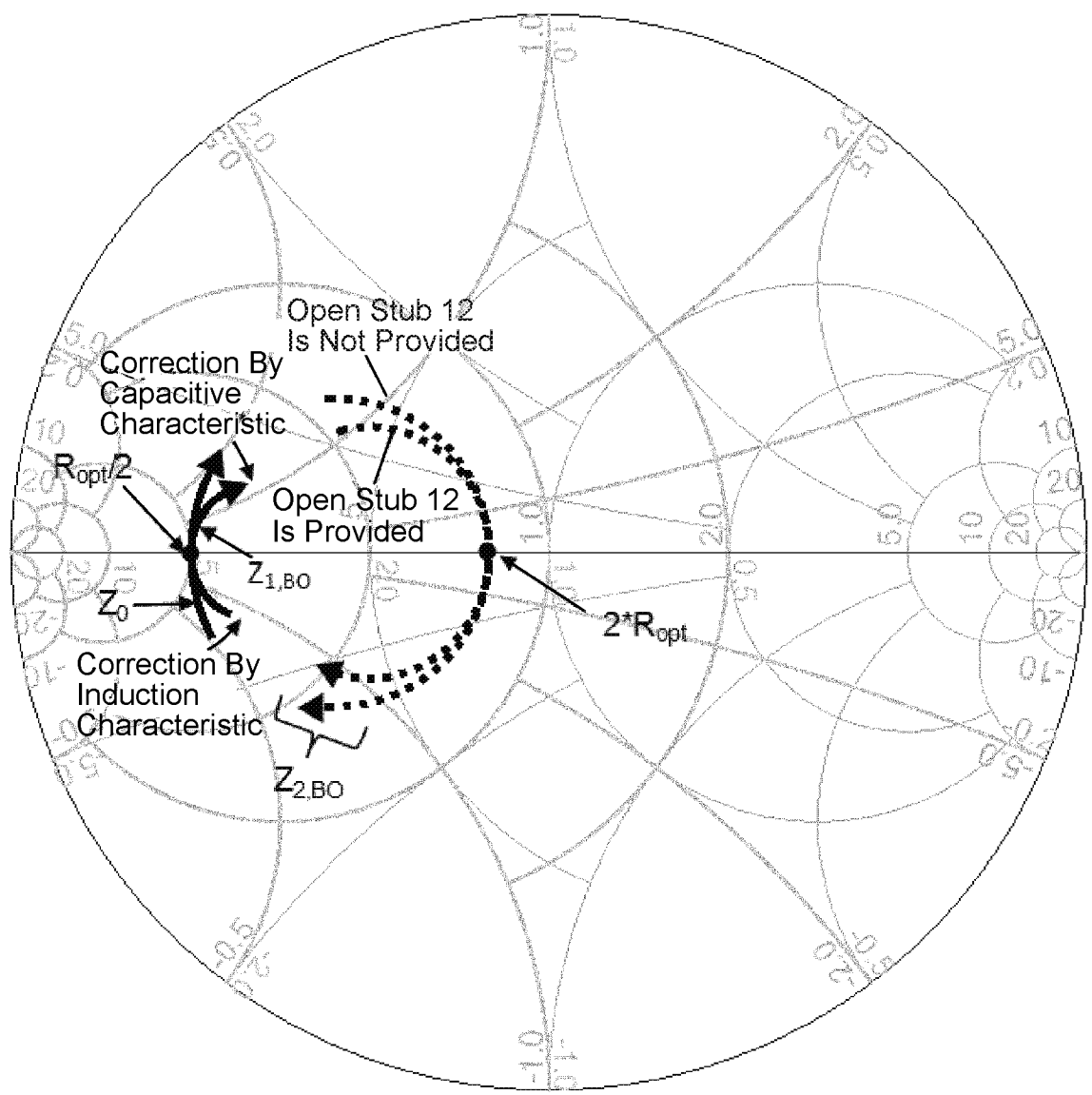
FIG. 5 is a diagram showing impedance transformation during back-off of the Doherty amplifier according to the first embodiment of the present invention.

FIG. 5 is a diagram for describing impedance transformation during back-off of the Doherty amplifier according to the first embodiment of the present invention.

The Smith chart in FIG. 5 is normalized at 50Ω. Since the output matching circuit 13 transforms the output load of 50Ω into an impedance lower than the output load of 50Ω, the impedance $Z_0$ as viewed from the output combination point (drain terminal 11 of the transistor 3 for the peak amplifier) toward the output load is capacitive on the low frequency side and inductive on the high frequency side, and has $R_{opt}/2$ at the center frequency of the working frequency band, as shown in FIG. 5.

Since the open stub 12 (here, an open stub with an electrical length of 180°) is capacitive on the high frequency side and inductive on the low frequency side in the working frequency band, the impedance $Z_{1,BO}$ as viewed from the output terminal (11a in FIG. 4) of the load modulation line 10 toward the open stub 12 and the output matching circuit 13 is brought closer to the center of the Smith chart than $Z_0$ as shown in FIG. 5, because the frequency characteristics thereof are compensated for by the open stub 12. In this way, a wide bandwidth can be achieved by the open stub 12.

As shown in FIGS. 2 and 3, the load modulation line 10 forms a 90° line together with the output capacitance 32 of the transistor 3 for the carrier amplifier and the output capacitance 42 of the transistor 4 for the peak amplifier, and therefore, the load modulation line 10 transforms $Z_{1,\,BO}$ to $Z_{2,\,BO}$ (impedance as viewed from the current source 31 of the transistor for the carrier amplifier toward the load modulation line 10).

As shown in FIG. 5, the frequency characteristics of $Z_{2,\,BO}$ are smaller when the open stub 12 is provided than that when the open stub 12 is not provided.

As described above, during back-off, in a case where the open stub 12 (here, an open stub having an electrical length of 180°) is provided, the impedance of the open stub is open at the center frequency, is capacitive on the high frequency side, and is inductive on the low frequency side. Therefore, the open stub can compensate for the frequency dependence caused by the output matching circuit 13, whereby wideband characteristics can be achieved.

Figure 6:
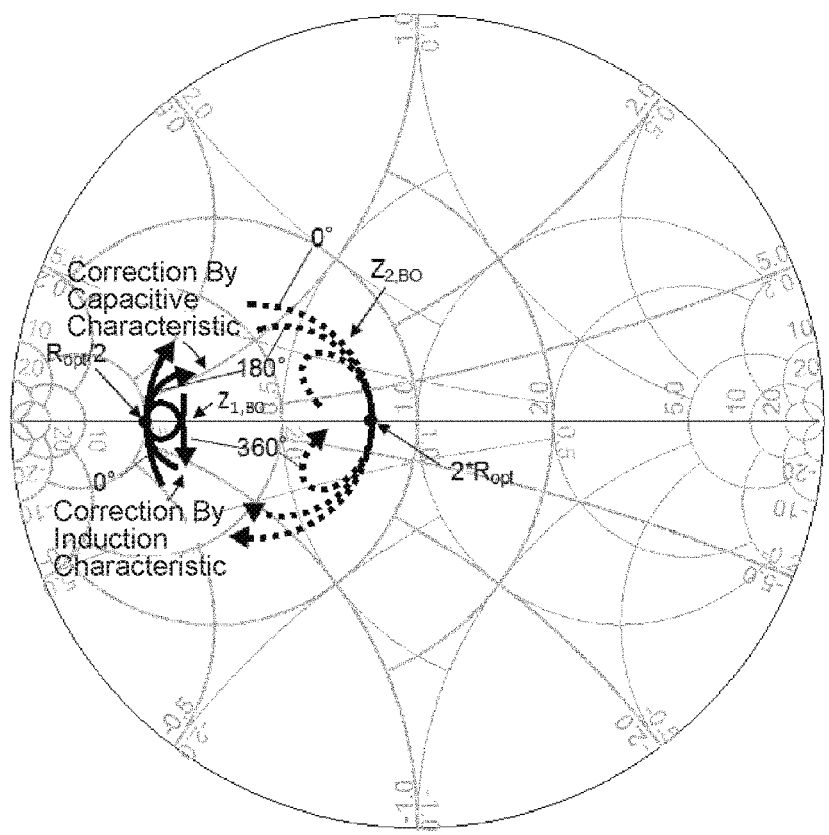
FIG. 6 is a diagram showing variations in impedance when an electrical length of an open stub 12 is changed to 0 degrees, 180 degrees, and 360 degrees in the Doherty amplifier according to the first embodiment of the present invention.

FIG. 6 is a diagram showing variations in impedance when the electrical length of the open stub 12 is changed to 0 degrees, 180 degrees, and 360 degrees in the Doherty amplifier according to the first embodiment of the present invention. An amount of correction can be increased with an increase in electrical length as shown in FIG. 6, whereby the wideband characteristics are increased.

Figure 7:
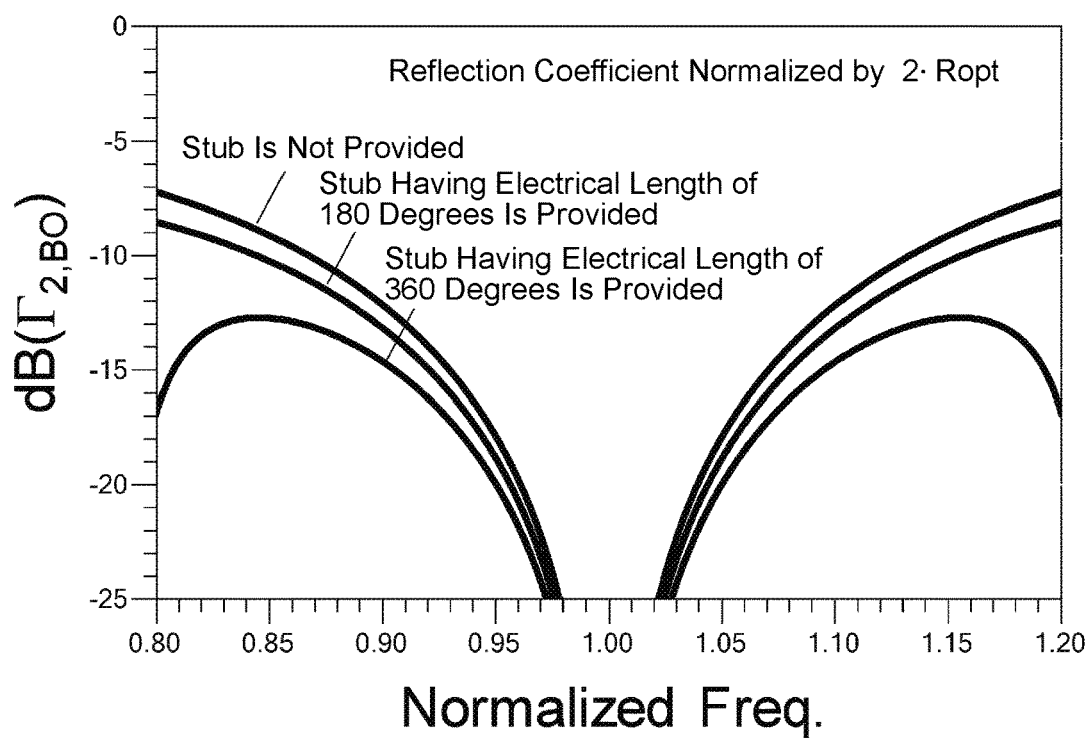
FIG. 7 is a diagram showing frequency dependence of reflection characteristics (dB ($\Gamma_{2,BO}$))) as viewed from a current source 31 of a transistor for a carrier amplifier toward an output load during back-off in the Doherty amplifier according to the first embodiment of the present invention.

FIG. 7 is a diagram showing frequency dependence of reflection characteristics (dB ($\Gamma_{2,BO}$))) as viewed from the current source 31 of the transistor for the carrier amplifier toward the output load during back-off in the Doherty amplifier according to the first embodiment of the present invention.

Unlike FIG. 6, FIG. 7 shows the reflection characteristics normalized by $2R_{opt}$. It can be seen from FIG. 7 that the wideband characteristics can be further increased by increasing the electrical length of the open stub 12.

Next, the operation of the Doherty amplifier according to the first embodiment of the present invention during saturation will be described.

Figure 8:
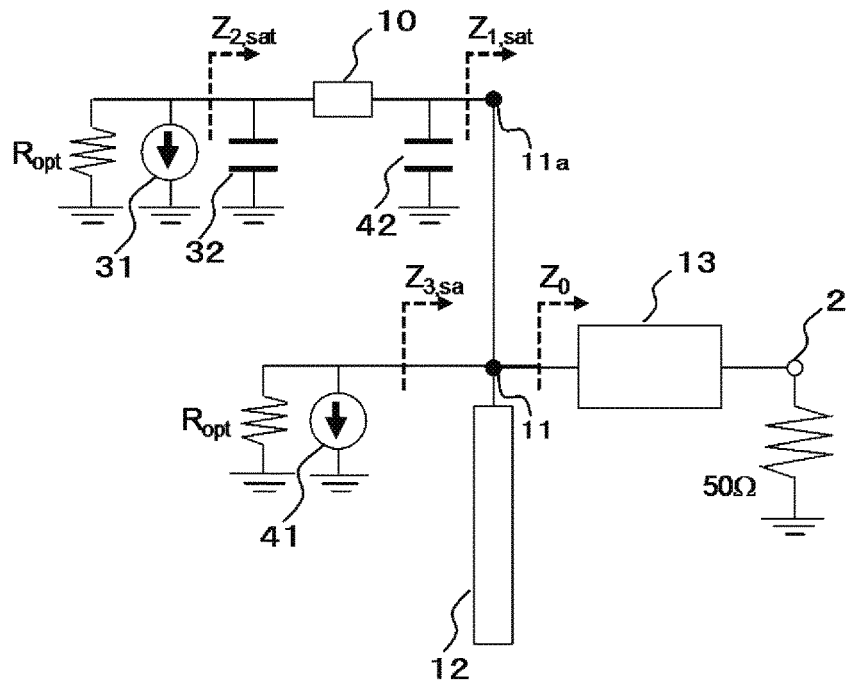
FIG. 8 is a diagram for describing impedance during saturation in which a peak amplifier is operating in the wideband Doherty amplifier according to the first embodiment of the present invention.

FIG. 8 is a diagram for describing impedances during saturation in which the peak amplifier is operating in the wideband Doherty amplifier according to the first embodiment of the present invention.

In the first embodiment, it is assumed that transistors of the same size are used for the transistor 3 for the carrier amplifier and the transistor 4 for the peak amplifier, so that currents flowing from both transistors are equal. Therefore, when the characteristic impedance (see FIGS. 2 and 3) of the transmission line equivalently constituted by the load modulation line 10, the output capacitance 32 of the transistor for the carrier amplifier, and the output capacitance 42 of the transistor for the peak amplifier is equal to $R_{opt}$, $Z_0$, $Z_{1,\,sat}$, and $Z_{3,\,sat}$ in FIG. 8 have the following relationship at the center frequency.

[Equation 3]

$$Z_{1,sat} = Z_{3,sat} = 2 * Z_o \qquad (3)$$

Figure 9:
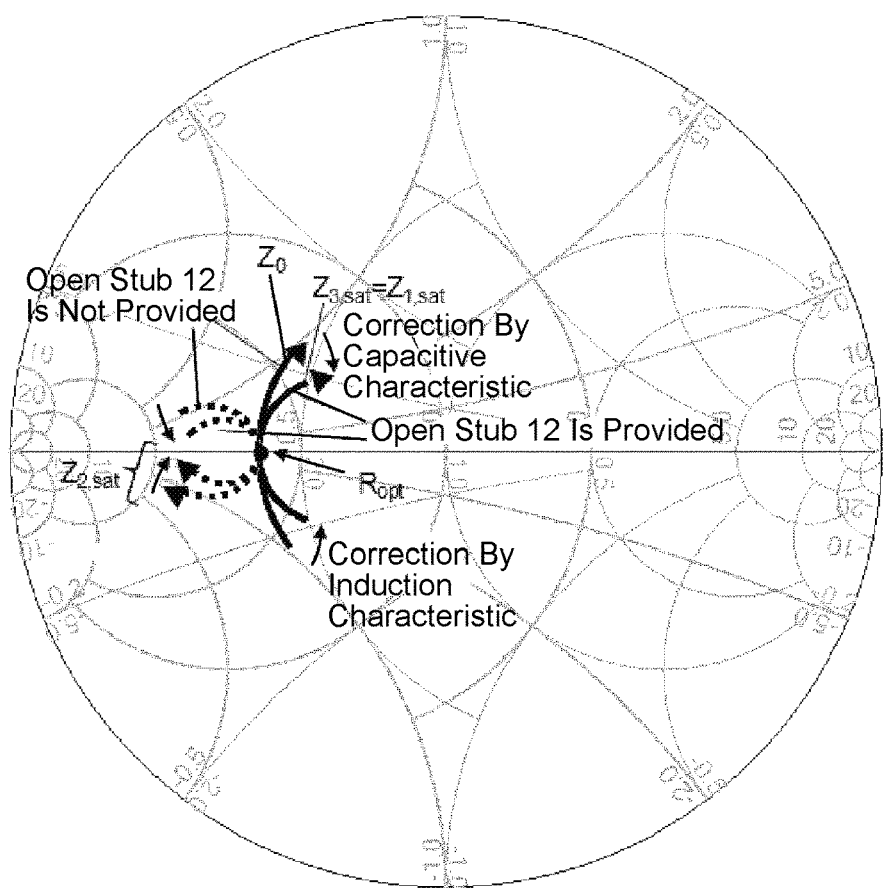
FIG. 9 is a diagram for describing impedance transformation during saturation in the Doherty amplifier according to the first embodiment of the present invention.

FIG. 9 is a diagram for describing impedance transformation during saturation in the Doherty amplifier according to the first embodiment of the present invention.

The Smith chart in FIG. 9 is normalized at 50Ω. As shown in FIG. 9, the output matching circuit 13 is designed in such a manner that $Z_0$ has an impedance $R_{opt}$ lower than 50Ω at the center frequency. Due to the transformation into an impedance lower than 50Ω, $Z_0$ is inductive on the high frequency side and capacitive on the low frequency side.

If the open stub 12 having an electrical length of an integral (n) multiple of 180 degrees is provided, the frequency dependence of $Z_0$ which is inductive on the high frequency side and capacitive on the low frequency side can be compensated for, because, similarly to the back-off, the impedance of the open stub 12 is open at the center frequency, capacitive on the high frequency side, and inductive on the low frequency side. Thus, the frequency dependence of $Z_{1,\,sat}$ can be decreased.

The impedance ($Z_{2,\,sat}$) as viewed from the current source 31 of the transistor for the carrier amplifier toward the output load is transformed by the load modulation line 10 and the output capacitances 32 and 42. In this case, $Z_{1,\,sat}$ having reduced frequency dependence is transformed, whereby the frequency dependence of $Z_{2,\,sat}$ is also reduced.

As shown in FIG. 9, the impedance ($Z_{2,\,sat}$) as viewed from the current source 31 of the transistor for the carrier amplifier toward the output matching circuit 13 and the impedance ($Z_{3,\,sat}$) as viewed from the current source 41 of the transistor for the peak amplifier toward the output matching circuit 13 have reduced frequency dependence due to the presence of the open stub 12. This is because the open stub 12 compensates for the frequency characteristics of the impedance caused when the output matching circuit 13 transforms the impedance of the output load of 50Ω.

More specifically, when the output matching circuit 13 transforms the impedance of the output load of 50Ω, the transformed impedance is capacitive on the low frequency side and inductive on the high frequency side in the working frequency band. On the other hand, the open stub 12 is inductive on the low frequency side and capacitive on the high frequency side in the working frequency band. Therefore, the open stub 12 compensates for the frequency characteristics caused by the impedance transformation by the output matching circuit 13.

As a result, wideband matching can be achieved in both the transistor 3 for the carrier amplifier and the transistor 4 for the peak amplifier during saturation.

Figure 10:
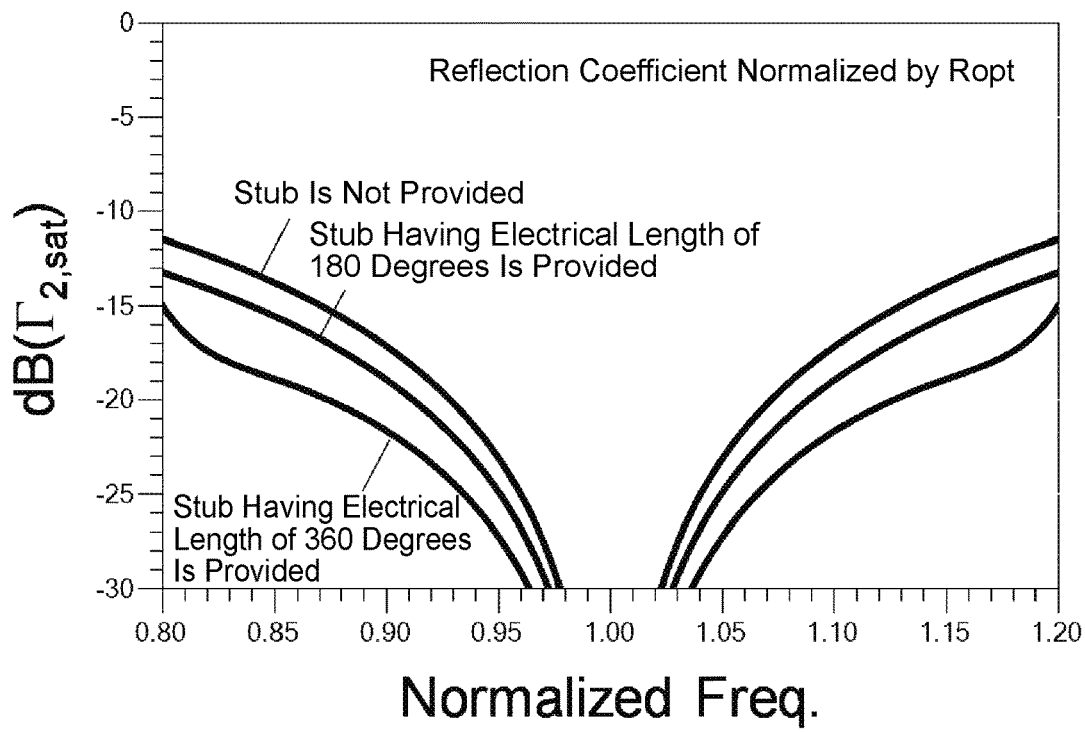
FIG. 10 is a diagram for describing frequency dependence of reflection characteristics (dB ($\Gamma_{2,sat}$)) as viewed from the current source 31 of the transistor for the carrier amplifier toward an output matching circuit 13 during saturation, when the electrical length of the open stub 12 is changed to 0 degrees, 180 degrees, and 360 degrees in the Doherty amplifier according to the first embodiment of the present invention.

FIG. 10 is a diagram for describing frequency dependence of reflection characteristics (dB ($\Gamma_{2,sat}$)) as viewed from the current source 31 of the transistor for the carrier amplifier toward the output matching circuit 13 during saturation, when the electrical length of the open stub 12 is changed to 0 degrees, 180 degrees, and 360 degrees in the Doherty amplifier according to the first embodiment of the present invention.

FIG. 10 shows the reflection characteristics normalized by $R_{opt}$. It can be seen from FIG. 10 that the wideband characteristics can be increased by increasing the electrical length of the open stub.

Next, the size of the Doherty amplifier according to the present invention will be described. As compared with the conventional Doherty amplifier (Non-Patent Literature), the wideband Doherty amplifier according to the present invention can eliminate an output matching circuit for a carrier amplifier and an output matching circuit for a peak amplifier, which are required in the conventional Doherty amplifier.

In addition, regarding the sum ($\theta_{SUM}$) of the electrical lengths of the load modulation line 10, the open stub 12 or frequency compensation line, and the input phase adjustment line 7 which are necessary for Doherty operation, the conventional wideband Doherty amplifier has a value expressed in Equation (4), whereas the Doherty amplifier according to the present invention has a value within the range expressed in Equation (5), and thus can decrease the sum ($\theta_{SUM}$) of the electrical lengths. Here, n is an integer.

[Equation 4]

$$\theta_{SUM}=90*4n \quad (4)$$

[Equation 5]

$$90*(2n+1)<\theta_{SUM}<90*(2n+2) \quad (5)$$

The conventional Doherty amplifier needs to connect the frequency compensation line to the peak amplifier in series. Therefore, when n=2, the electrical length of the input phase adjustment line is 270° which is longer.

On the other hand, in the present invention, the open stub 12 is connected in parallel to (shunt-connected to) the transistor 4 for the peak amplifier. Therefore, the electrical length of the input phase adjustment line remains 90°, and thus, the present invention can decrease the electrical length as compared with the conventional Doherty amplifier. Further, in the conventional Doherty amplifier, the frequency compensation line needs to be connected in series, which increases the length from the input terminal 1 to the output terminal 2, whereas in the Doherty amplifier according to the present invention, the open stub 12 is connected in parallel to (shunt-connected to) the transistor 4 for the peak amplifier, so that the length can be shortened.

As is clear from the above, according to the first embodiment of the present invention, the frequency characteristics caused by the output matching circuit 13 can be compensated for by the open stub 12, whereby a broader bandwidth can be achieved during both back-off and saturation.

It is to be noted that, although the characteristic impedance of the open stub 12 having an electrical length of an integral (n) multiple of 180 degrees is assumed to be a certain value, it may be any appropriate value.

Figure 11:
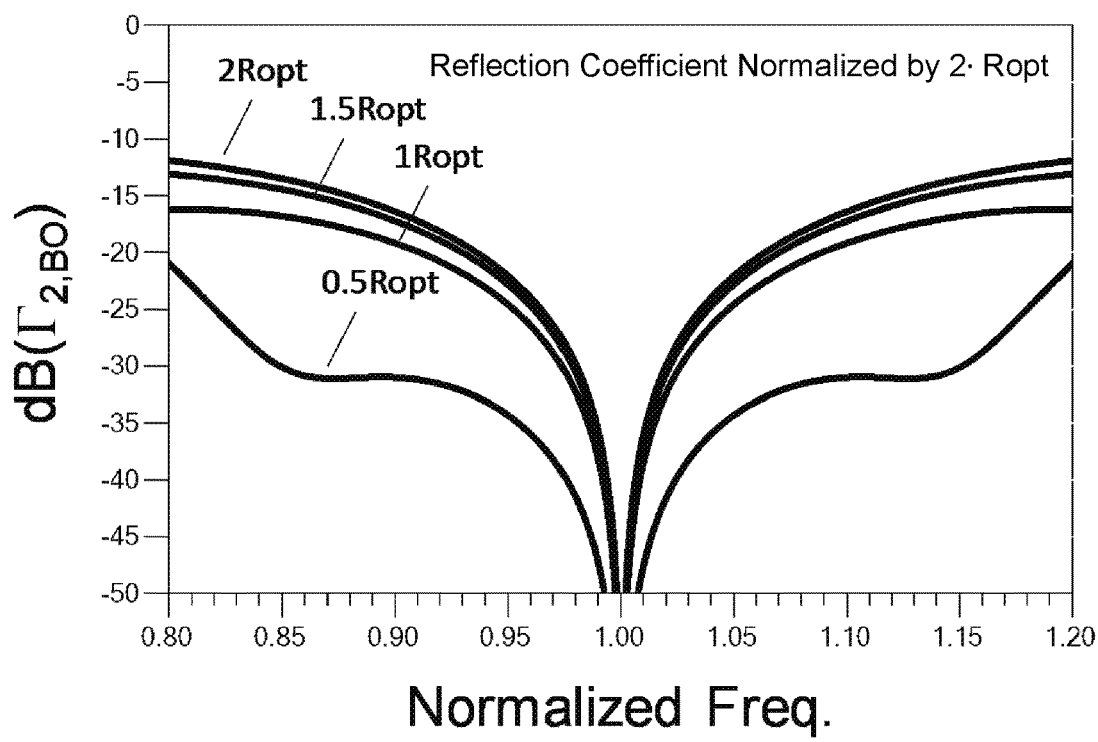
FIG. 11 is a diagram in which frequency dependence of reflection characteristics as viewed from the current source 31 of the transistor for the carrier amplifier toward the output matching circuit 13 during back-off is calculated by varying a characteristic impedance of the open stub 12 in the Doherty amplifier according to the first embodiment of the present invention.

FIG. 11 is a diagram in which the frequency dependence of reflection characteristics as viewed from the current source 31 of the transistor for the carrier amplifier toward the output matching circuit 13 during back-off is calculated by varying the characteristic impedance of the open stub 12 in the Doherty amplifier according to the first embodiment of the present invention.

In FIG. 11, the characteristic impedance of the open stub is normalized by the real part ($R_{opt}$) of the output impedance when the transistor is saturated. As shown in FIG. 11, it can be seen that, as the characteristic impedance of the open stub is decreased, the wideband characteristic is increased.

In the first embodiment, the electrical length of the open stub 12 is assumed to be an integral (n) multiple of 180 degrees of the frequency to be used. However, if the stub is capacitive and inductive within the working frequency band even when the electrical length is a value obtained by adding or subtracting about 35 degrees to or from the value of an integral (n) multiple of 180 degrees of the frequency to be used, wideband characteristics can be increased, as compared to the case where the stub is not used.

Figure 12:
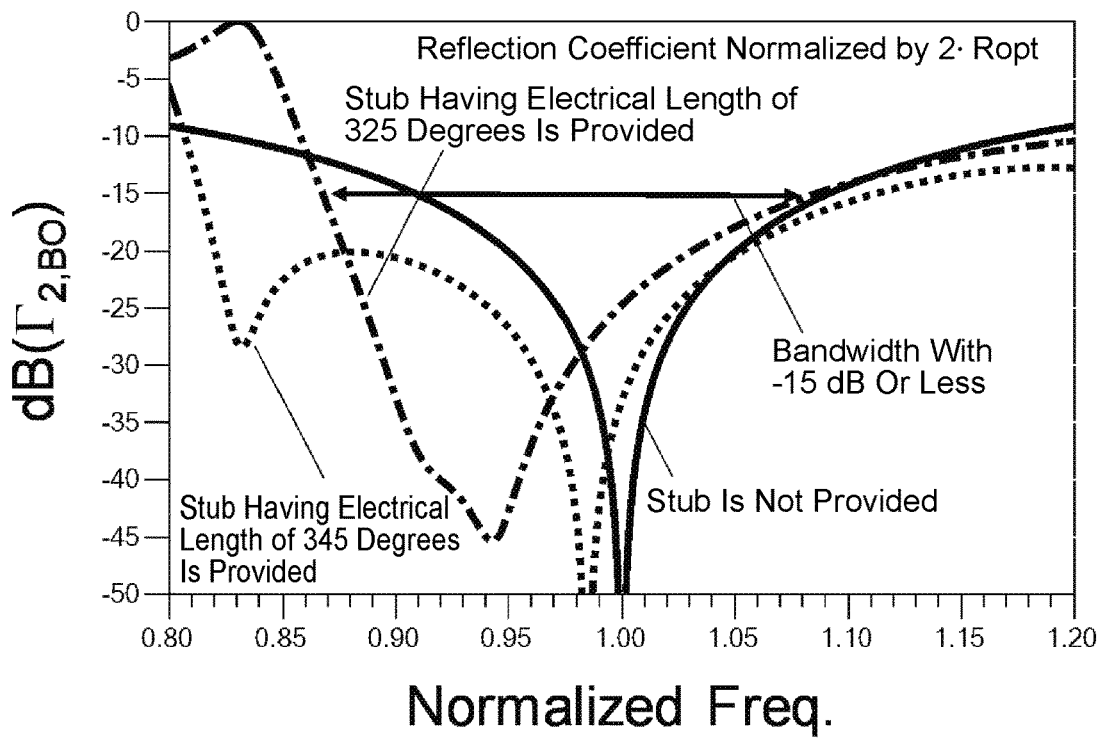
FIG. 12 is a diagram showing frequency dependence of reflection characteristics as viewed from the current source 31 of the transistor for the carrier amplifier toward the output matching circuit 13 during back-off, when the electrical length of the open stub 12 is 325° and 345° in the Doherty amplifier according to the first embodiment of the present invention.

FIG. 12 is a diagram showing frequency dependence of reflection characteristics as viewed from the current source 31 of the transistor for the carrier amplifier toward the output matching circuit 13 during back-off, when the electrical length of the open stub 12 is 325° and 345° in the Doherty amplifier according to the first embodiment of the present invention.

It can be seen from FIG. 12 that, comparing the cases where the stubs having electrical lengths of 325 degrees and 345 degrees which are smaller than 360 degrees are provided and the case where no stub is provided, a bandwidth in which reflection of −15 dB or less occurs is increased.

Figure 13:
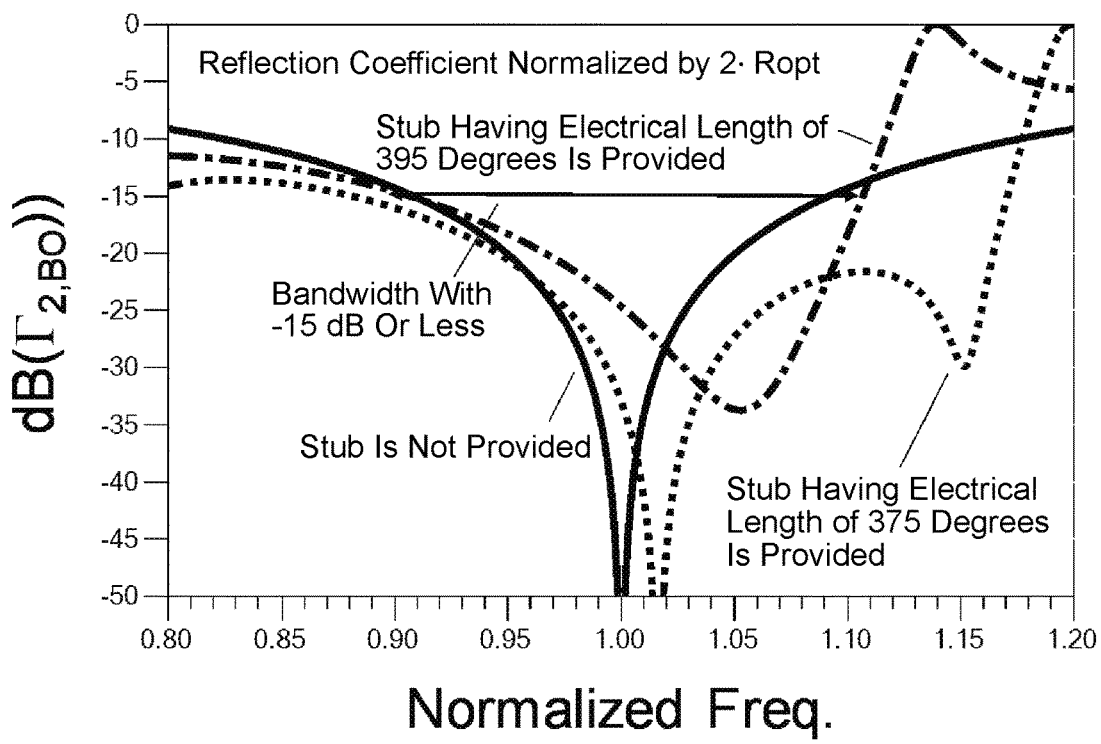
FIG. 13 is a diagram showing frequency dependence of reflection characteristics as viewed from the current source 31 of the transistor for the carrier amplifier toward the output matching circuit 13 during back-off, when the electrical length of the open stub 12 is 375° and 395° in the Doherty amplifier according to the first embodiment of the present invention.

FIG. 13 is a diagram showing frequency dependence of reflection characteristics as viewed from the current source 31 of the transistor for the carrier amplifier toward the output matching circuit 13 during back-off, when the electrical length of the open stub 12 is 375° and 395° in the Doherty amplifier according to the first embodiment of the present invention.

It can be seen from FIG. 13 that, comparing the cases where the stubs having electrical lengths of 395 degrees and 375 degrees which are greater than 360 degrees are provided and the case where no stub is provided, a bandwidth in which reflection of −15 dB or less occurs is increased.

Further, although the open stub 12 is assumed to be constituted by an open stub having an electrical length of an integral (n) multiple of 180 degrees in the first embodiment, a short stub may be used which includes a transmission line having an electrical length shorter than the integral (n) multiple of 180 degrees by 90 degrees and a capacitor short-circuited at the center frequency and having one end which is short-circuited.

Figure 14:
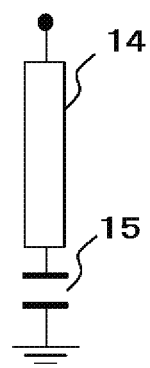
FIG. 14 is a diagram showing an example of a short stub in the Doherty amplifier according to the first embodiment of the present invention.

FIG. 14 is a diagram showing an example of a short stub in the Doherty amplifier according to the first embodiment of the present invention.

The impedance of the short stub shown in FIG. 14 is open at the center frequency, capacitive on the high frequency side, and inductive on the low frequency side, as with the open stub having an electrical length of an integral (n) multiple of 180 degrees. Therefore, the short stub can compensate for the frequency dependence added by the output matching circuit, thereby being capable of achieving wideband characteristics.

The electrical length of the transmission line of the short stub is assumed to be shorter than an integral (n) multiple of 180 degrees of the frequency to be used by 90 degrees. However, as described above, if the stub is capacitive and inductive within the working frequency band even when the electrical length is a value obtained by adding or subtracting about 35 degrees to or from the value of an integral multiple of 180 degrees of the frequency to be used, wideband characteristics can be increased, compared with the case where no stub is provided.

It is to be noted that the above embodiments can be freely combined, or any component in the embodiments can be modified or omitted, within the scope of the present invention.

REFERENCE SIGNS LIST

1: input terminal, 2: output terminal, 3: transistor for carrier amplifier, 4: transistor for peak amplifier, 5: input divider, 6: input matching circuit for carrier amplifier, 7: input phase adjustment line, 8: input matching circuit for peak amplifier, 9: drain terminal of transistor for carrier amplifier, 10: load modulation line, 11: drain terminal (output combination point) of transistor for peak amplifier, 11a: output terminal of load modulation line, 12: open stub, 13: output matching circuit, 14: transmission line, 15: capacitor, 31: current source of transistor for carrier amplifier, 32: output capacitance of transistor 3 for carrier amplifier, 41: current source of transistor 4 for peak amplifier, 42: output capacitance of transistor for peak amplifier

The invention claimed is:

1. A Doherty amplifier comprising:
   a transistor for a carrier amplifier;
   a transistor for a peak amplifier;
   a transmission line connected between an output terminal of the transistor for the carrier amplifier and an output terminal of the transistor for the peak amplifier;
   a stub that is connected in parallel to the output terminal of the transistor for the peak amplifier and that is capacitive and inductive in a working frequency band; and
   an output matching circuit connected to the output terminal of the transistor for the peak amplifier, the transmission line, and an output load, the output matching circuit to transform an impedance of the output load into an impedance lower than the impedance of the output load,
   wherein an output terminal of the transistor for the peak amplifier is connected directly to the stub and the transmission line.

2. The Doherty amplifier according to claim 1, wherein the transmission line has an electrical length of less than 90°.

3. The Doherty amplifier according to claim 2, wherein the transmission line has a characteristic impedance higher than a real part of an output impedance of the transistor for the carrier amplifier.

4. The Doherty amplifier according to claim 3, wherein the stub is an open stub having an electrical length of an integral multiple of 180° at one frequency in the working frequency band.

5. The Doherty amplifier according to claim 3, wherein the stub is a short stub having an electrical length of an integral multiple of 90° at one frequency in the working frequency band.

* * * * *